(12) United States Patent
Wei et al.

(10) Patent No.: US 12,436,469 B2
(45) Date of Patent: Oct. 7, 2025

(54) MEASURING METHOD FOR MEASURING OVERLAY SHIFT AND NON-TRANSIENT COMPUTER READABLE STORAGE MEDIUM

(71) Applicant: NANYA TECHNOLOGY CORPORATION, New Taipei (TW)

(72) Inventors: Chun Yen Wei, Taipei (TW); Tsu-Wen Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 293 days.

(21) Appl. No.: 18/187,679

(22) Filed: Mar. 22, 2023

(65) Prior Publication Data

US 2024/0319616 A1    Sep. 26, 2024

(51) Int. Cl.
| | |
|---|---|
| G03F 7/00 | (2006.01) |
| G03F 7/06 | (2006.01) |
| G03F 7/20 | (2006.01) |
| H01L 21/66 | (2006.01) |
| H01L 21/67 | (2006.01) |
| H01L 23/58 | (2006.01) |
| H01L 29/10 | (2006.01) |

(52) U.S. Cl.
CPC .... G03F 7/70633 (2013.01); G03F 7/706837 (2023.05)

(58) Field of Classification Search
CPC ...... G03F 7/00; G03F 7/0633; G03F 7/06837; G03F 7/20; H01L 23/58; H01L 29/10; H01L 21/66; H01L 21/67
See application file for complete search history.

(56) References Cited

U.S. PATENT DOCUMENTS

| | | | |
|---|---|---|---|
| 11,621,202 B2 * | 4/2023 | Li | H01L 22/20 |
| | | | 257/48 |
| 2016/0148850 A1 * | 5/2016 | David | G06N 7/01 |
| | | | 355/53 |

* cited by examiner

*Primary Examiner* — Neel D Shah
(74) *Attorney, Agent, or Firm* — CKC & Partners Co., LLC

(57) ABSTRACT

A measuring method for measuring an overlay shift between two wafers, comprising: providing a previous wafer layer, a to-be-measured wafer layer and a measuring circuit layer, wherein each of the previous wafer layer and the to-be-measured wafer layer comprises a first group of dies; measuring, by a plurality of probes of the measuring circuit layer, the first group of dies of the to-be-measured wafer layer; generating a measurement result according to at least the measuring to the first group of dies; and comparing the measurement result with a standard data to determine the overlay shift between the previous wafer layer and the to-be-measured wafer layer, wherein the to-be-measured wafer layer is between the previous wafer layer and the measuring circuit layer and is connected to the previous wafer layer and the measuring circuit layer.

20 Claims, 9 Drawing Sheets

MEASURING METHOD FOR MEASURING OVERLAY SHIFT AND NON-TRANSIENT COMPUTER READABLE STORAGE MEDIUM

BACKGROUND

Technical Field

The present disclosure relates to a measuring method for measuring overlay shift and also to a non-transient computer readable storage medium. More particularly, the present disclosure relates to a measuring method of determining whether the overlay shift exists or not and also to a non-transient computer readable storage medium.

Description of Related Art

When manufacturing wafers, the wafer layers need to be aligned to optimum conditions, so as to make the wafers function properly. That is, the shift between two adjacent wafer layers (i.e., overlay shift) needs to be close to zero.

Among the methods for measuring overlay shift in present, optical measuring and electron beam measuring are often used to shoot images of the wafers. However, the measurement result of the optical measuring may be affected by the structure of the wafers. When the bottom part of the wafers is blocked by other parts of the wafers, incomplete images will be generated, resulting in imprecise measurement results. On the other hand, the electron beam measuring is able to shoot the entire structure of the wafers with a high-voltage electron beam, but the power consumption is quite considerable. Therefore, how to effectively measure the overlay shift between two adjacent wafer layers is one of the topics in this field.

SUMMARY

The disclosure provides a measuring method for measuring an overlay shift between two wafers, comprising: providing a previous wafer layer, a to-be-measured wafer layer and a measuring circuit layer, wherein each of the previous wafer layer and the to-be-measured wafer layer comprises a first group of dies; measuring, by a plurality of probes of the measuring circuit layer, the first group of dies of the to-be-measured wafer layer; generating a measurement result according to at least the measuring to the first group of dies; and comparing the measurement result with a standard data to determine the overlay shift between the previous wafer layer and the to-be-measured wafer layer, wherein the to-be-measured wafer layer is between the previous wafer layer and the measuring circuit layer and is connected to the previous wafer layer and the measuring circuit layer.

The disclosure provides a non-transient computer readable storage medium, storing a plurality of computer readable instructions, when the plurality of computer readable instructions are executed for measuring an overlay shift between two wafers, by one or a plurality of processors, the one or the plurality of processors is configured to perform the following operations: measuring, by a plurality of probes of a measuring circuit layer, a first group of dies of a to-be-measured wafer layer; generating a measurement result according to at least the measuring to the first group of dies; and comparing the measurement result with a standard data to determine the overlay shift between a previous wafer layer and the to-be-measured wafer layer, wherein the to-be-measured wafer layer is between the previous wafer layer and the measuring circuit layer and is connected to the previous wafer layer and the measuring circuit layer.

With the measuring method and the non-transient computer readable storage medium of present disclosure, it is possible to measure the overlay shift between two adjacent wafer layers with lower power consumption and prevent the measurement result from being affected by the structure of the wafers.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
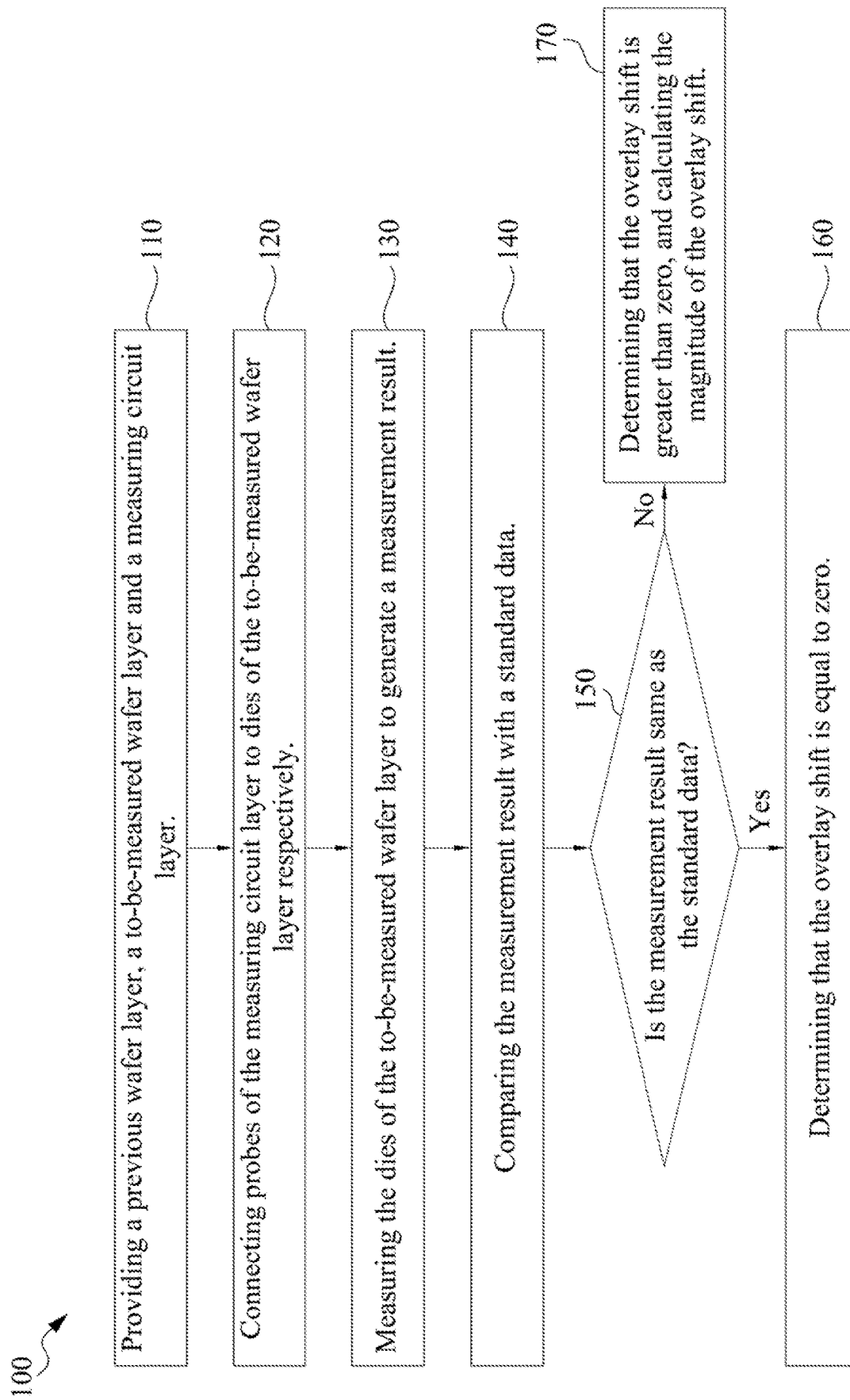
FIG. 1 is a flowchart of a measuring method in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a flowchart of a measuring method 100 in accordance with some embodiments of the present disclosure. In some embodiments, the measuring method 100 comprises steps 110-170.

Figure 2A:
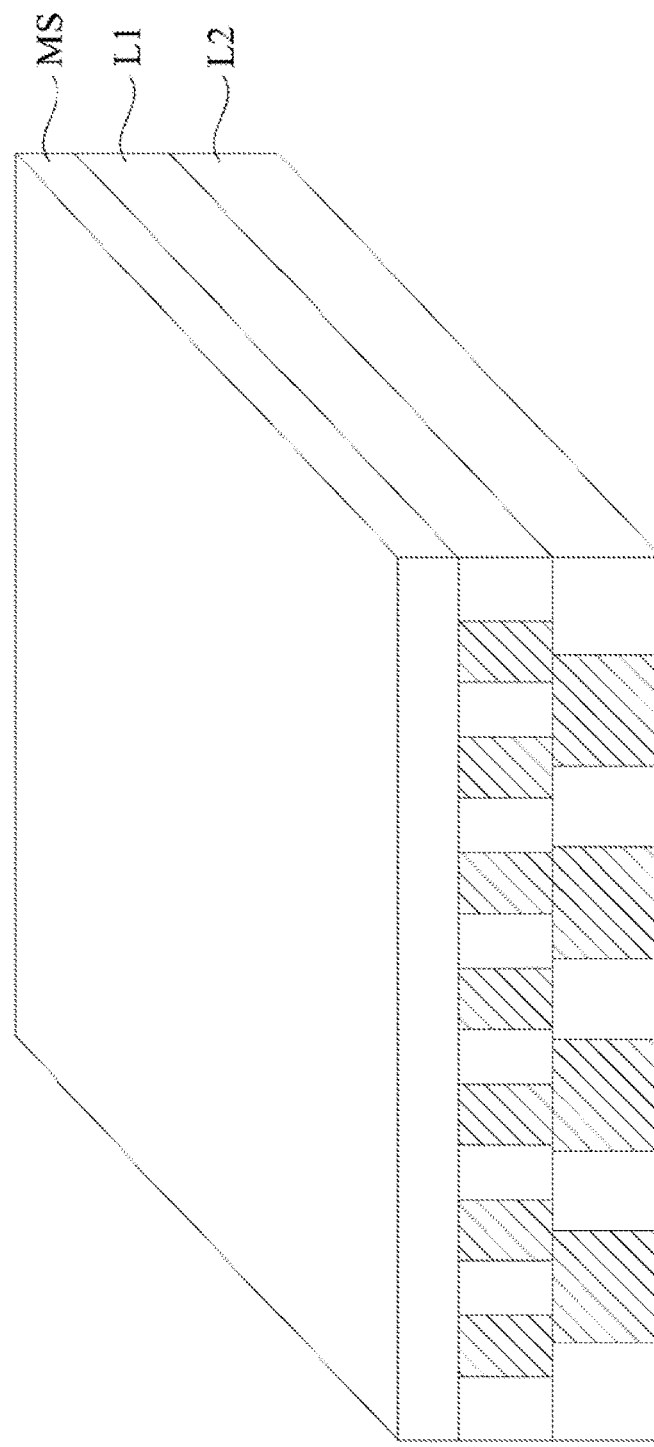
FIG. 2A is a diagram of a to-be-measured wafer layer, a previous wafer layer and a measuring circuit layer in accordance with some embodiments of the present disclosure.
Figure 2B:
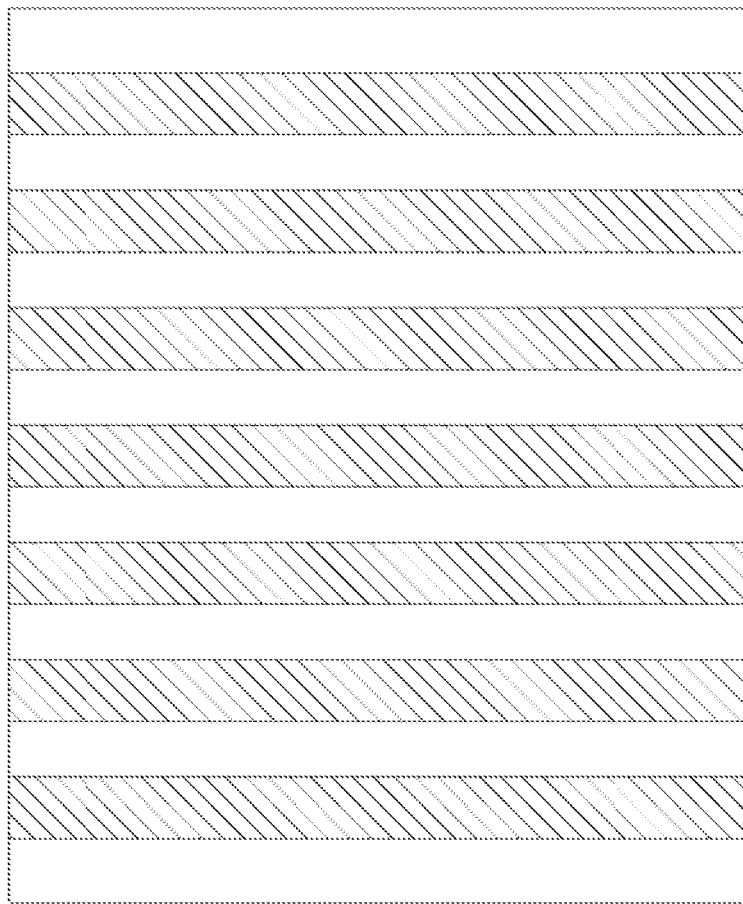
FIG. 2B is a top-view diagram of a to-be-measured wafer layer in accordance with some embodiments of the present disclosure.

For the sake of clarity, please refer to FIG. 1 and FIGS. 2A-2B together. FIG. 2A is a diagram of a measuring circuit layer MS, a to-be-measured wafer layer L1 and a previous wafer layer L2 in accordance with some embodiments of the present disclosure. FIG. 2B is a top-view diagram of the to-be-measured wafer layer L1 in accordance with some embodiments of the present disclosure. In step 110, the measuring circuit layer MS, the to-be-measured wafer layer L1 and the previous wafer layer L2 are provided.

In some embodiments, as shown in FIGS. 2A-2B, each of the to-be-measured wafer layer L1 and the previous wafer layer L2 comprises a group of dies arranged in direction D1 and extending in direction D2. In some embodiments, in the to-be-measured wafer layer L1, the widths of the dies in direction D1 are the same, and the spacing between any two adjacent dies in direction D1 are also the same; in the previous wafer layer L2, the widths of the dies in direction D1 are the same, and the spacing between any two adjacent dies in direction D1 are also the same.

In some embodiments, the to-be-measured wafer layer L1 overlaps the previous wafer layer L2 in direction D3, and the measuring circuit layer MS overlaps the to-be-measured wafer layer L1 in direction D3, wherein directions D1-D3 are perpendicular to each other. Therefore, in the embodiments that direction D3 is vertical direction, the to-be-measured wafer layer L1 is above the previous wafer layer L2, and the measuring circuit layer MS is above the to-be-measured wafer layer L1.

In some embodiments, the measuring circuit layer MS comprises a plurality of probes (not shown in FIG. 2A) insulated to each other. In step 120, the probes are respectively connected to the dies of the to-be-measured wafer layer L1.

In step 130, the dies of the to-be-measured wafer layer L1 are measured by the probes, so as to generate a measurement result. For the sake of brevity, the overlay shift between the previous wafer layer L2 and the to-be-measured wafer layer L1 is hereinafter referred to as "the overlay shift".

Figure 3A:
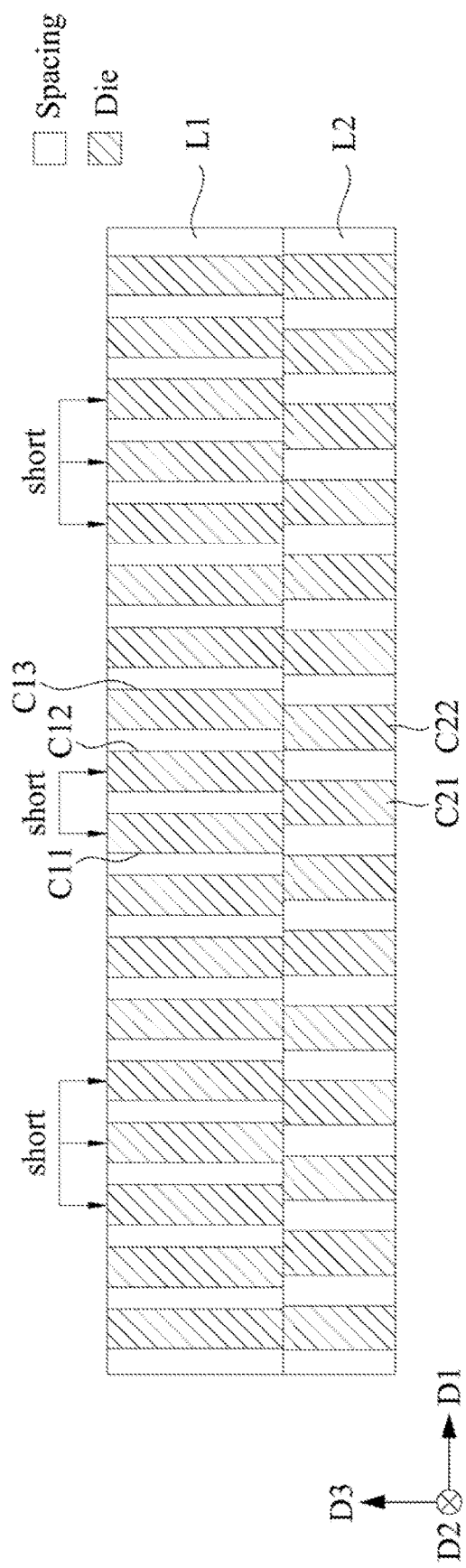
FIG. 3A is a side-view diagram of a to-be-measured wafer layer and a previous wafer layer in accordance with some embodiments of the present disclosure.
Figure 3B:
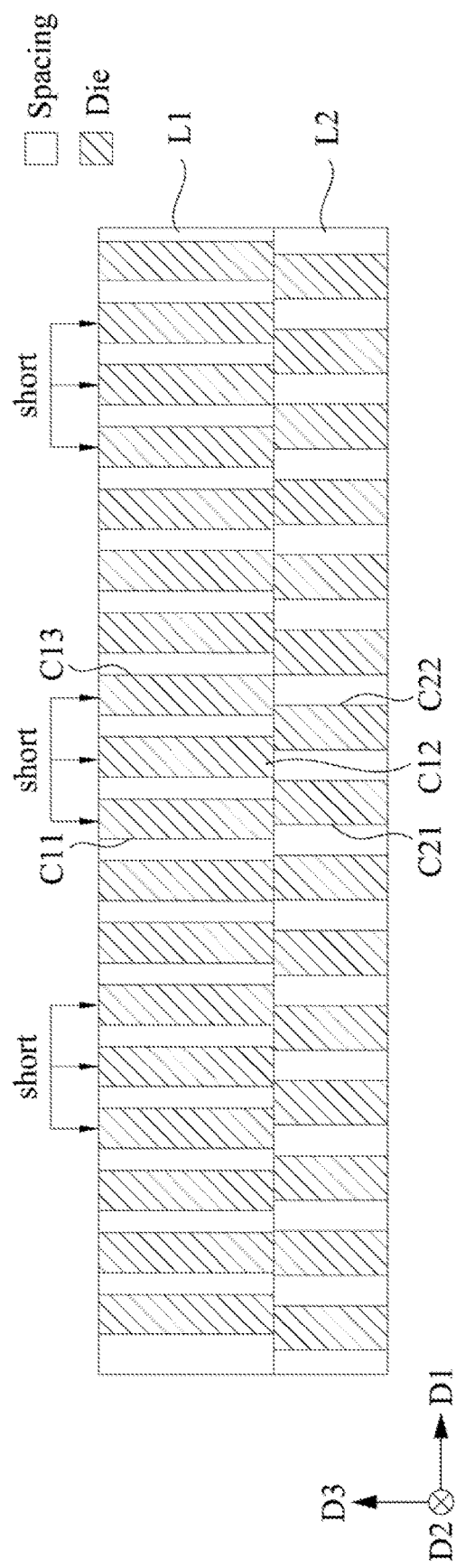
FIG. 3B is a side-view diagram of a to-be-measured wafer layer and a previous wafer layer in accordance with some embodiments of the present disclosure.

In some embodiments, the probes are used to measure the conduction relationship between the dies of the to-be-measured wafer layer L1, and the conduction relationship between the dies of the to-be-measured wafer layer L1 is used as the aforementioned measurement result. Please refer to FIGS. 3A-3B. FIG. 3A is a side-view diagram of the to-be-measured wafer layer L1 and the previous wafer layer L2 in accordance with the embodiments that the overlay shift is zero. FIG. 3B is a side-view diagram of the to-be-measured wafer layer L1 and the previous wafer layer L2 in accordance with the embodiments that the overlay shift is not zero. In the embodiments of FIGS. 3A-3B, the to-be-measured wafer layer L1 comprises at least dies C11-C13, and the previous wafer layer L2 comprises at least dies C21-C22.

First, in the embodiments of FIG. 3A, the dies C11 and C12 overlap and electrically connect to the die C21, and the die C13 overlaps and electrically connects to the die C22 only. Therefore, the probes respectively connected to the dies C11 and C12 are short to each other through the die C21, and the probe connected to the die C13 is not short to any other probes.

On the other hand, in the embodiments of FIG. 3B, the dies C11 and C12 overlap and electrically connect to the die C21, and the dies C12 and C13 overlap and electrically connect to the die C22. Therefore, the probes respectively connected to the dies C11-C13 are short to each other through dies C21-C22.

Please refer to FIG. 1 again. In step 140, the measurement result is compared with standard data, wherein the standard data represents the conduction relationship between dies of a wafer layer having no overlay shift. In some embodiments, the standard data is previously stored in a memory device and can be accessed by a test device performing the measuring method 100, in which the test device comprises the measuring circuit layer MS.

In step 150, whether the measurement result is same as the standard data is determined. When the measurement result is same as the standard data, step 160 will be performed. On the contrary, when the measurement result is different from the standard data, step 170 will be performed.

In step 160, the overlay shift is determined to be equal to zero. In step 170, the overlay shift is determined to be greater than zero, and the magnitude of the overlay shift is calculated based on the measurement result and the standard data.

In the embodiment of FIG. 3A, since the measurement result generated is same as the standard data, step 160 will be performed and the overlay shift will be determined to be equal to zero.

On the other hand, in the embodiment of FIG. 3B, since the measurement result generated is different from the standard data, step 170 will be performed and the magnitude of the overlay shift will be determined to be greater than zero and further calculated.

Figure 4A:
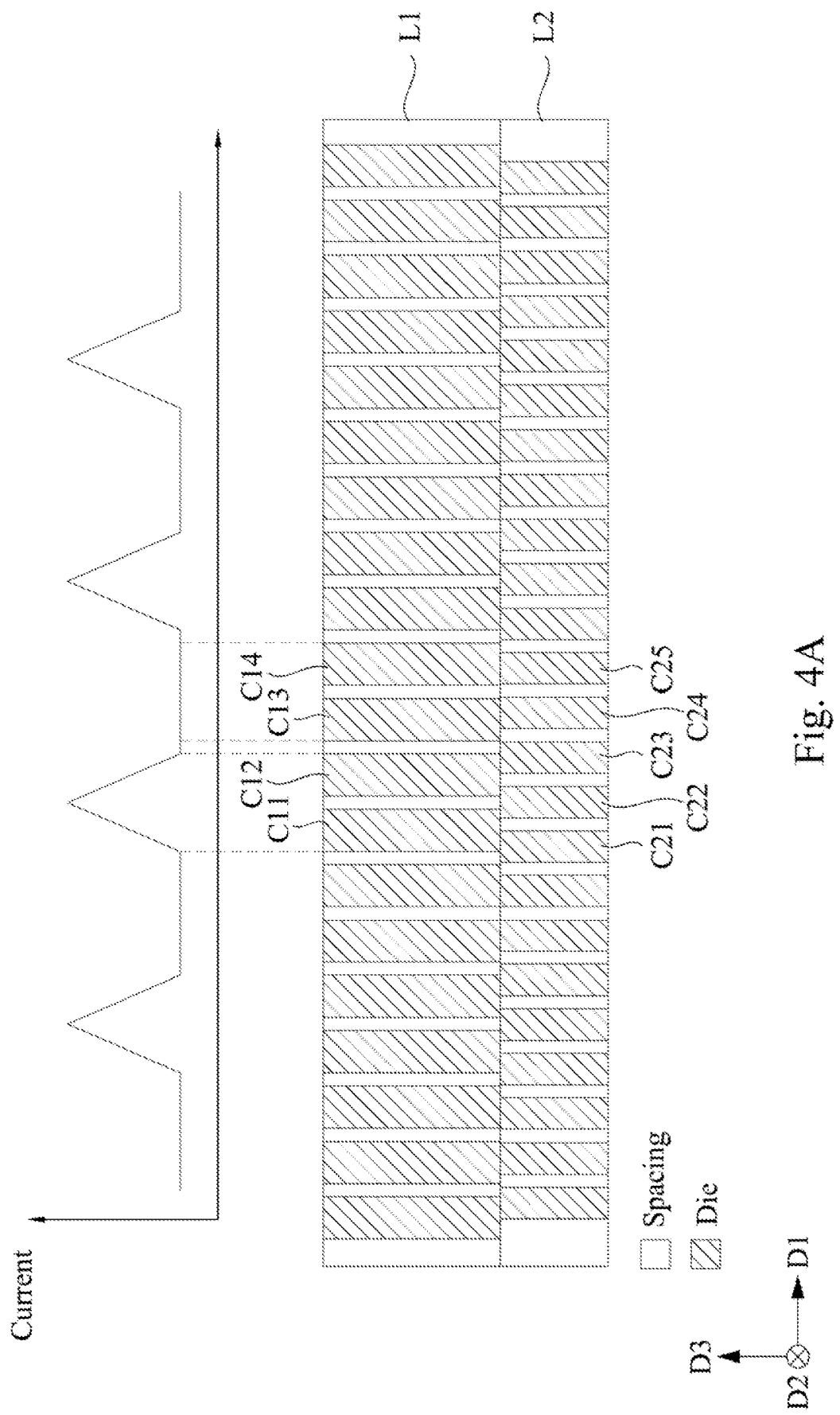
FIG. 4A is a schematic diagram illustrating a current distribution of the dies of a to-be-measured wafer layer in accordance with some embodiments of the present disclosure.
Figure 4B:
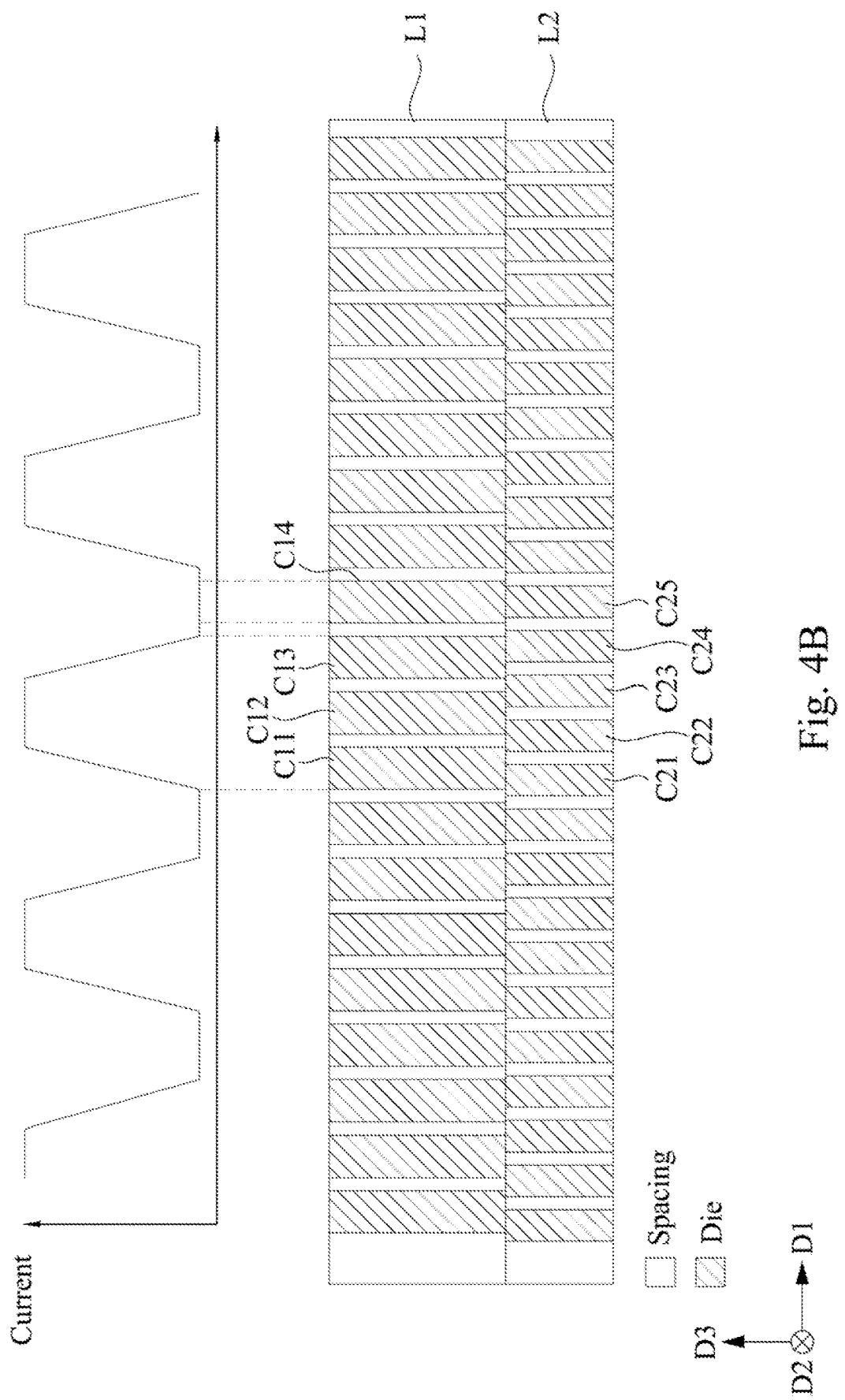
FIG. 4B is a schematic diagram illustrating a current distribution of the dies of a to-be-measured wafer layer in accordance with some embodiments of the present disclosure.

The measurement result is not limited to the conduction relationship between the dies of the to-be-measured wafer layer L1. In some embodiments, the probes are used to measure currents passing through the dies of the to-be-measured wafer layer L1, and the measured current distribution among the dies of the to-be-measured wafer layer L1 is used as the aforementioned measurement result. Please refer to FIGS. 4A-4B. FIG. 4A is a schematic diagram illustrating a current distribution of the dies of the to-be-measured wafer layer L1, in accordance with the embodiments that the overlay shift is zero. FIG. 4B is a schematic diagram illustrating a current distribution of the dies of the to-be-measured wafer layer L1, in accordance with the embodiments that the overlay shift is not zero. In the embodiments of FIGS. 4A-4B, the to-be-measured wafer layer L1 comprises at least dies C11-C14, and the previous wafer layer L2 comprises at least dies C21-C25.

First, in the embodiments of FIG. 4A, the die C11 overlaps and electrically connects to the dies C21 and C22, the die C12 overlaps and electrically connects to the dies C22 and C23, the die C13 overlaps and electrically connects to the die C24 only, and the die C14 overlaps and electrically connects to the die C25 only. Therefore, the probes respectively connected to the dies C11 and C12 are short to each other through the die C22, and the probes respectively connected to the dies C13 and C14 are not short to any other probes.

On the other hand, in the embodiments of FIG. 4B, the die C11 overlaps and electrically connects to the dies C21 and C22, the die C12 overlaps and electrically connects to the dies C22 and C23, the die C13 overlaps and electrically connects to the dies C23 and C24, and the die C14 overlaps and electrically connects to the die C25 only. Therefore, the probes respectively connected to the dies C11-C13 are short to each other through dies C22-C23, and the probe connected to the die C14 is not short to any other probes.

In some embodiments, the standard data represents the current distribution of dies of a wafer layer having no overlay shift.

When two adjacent dies of the to-be-measured wafer layer L1 are short to each other, the current passing through the two dies will increase because the equivalent resistance of these two dies is decreased.

As shown in FIGS. 4A-4B, the current distribution changes to a high level at the position where a die of the to-be-measured wafer layer L1 is short to another die of the to-be-measured wafer layer L1, and changes to a low level at the position where a die of the to-be-measured wafer layer L1 is not short to any other dies of the to-be-measured wafer layer L1.

In the embodiment of FIG. 4A, since the measurement result generated is same as the standard data, step 160 will be performed and the overlay shift will be determined to be equal to zero.

On the other hand, in the embodiments of FIG. 4B, since the measurement result generated is different from the standard data, step 170 will be performed and the magnitude of the overlay shift will be determined to be greater than zero and further calculated.

It should be noted that the arrangement of dies in the previous wafer layer L2 and the to-be-measured wafer layer L1, the conduction relationship and the current distribution in present disclosure are only examples, and are not intended to limit the present disclosure. The other arrangement of dies in the previous wafer layer L2 and the to-be-measured wafer layer L1, conduction relationship and current distribution are within the scope of the present disclosure.

Figure 5:
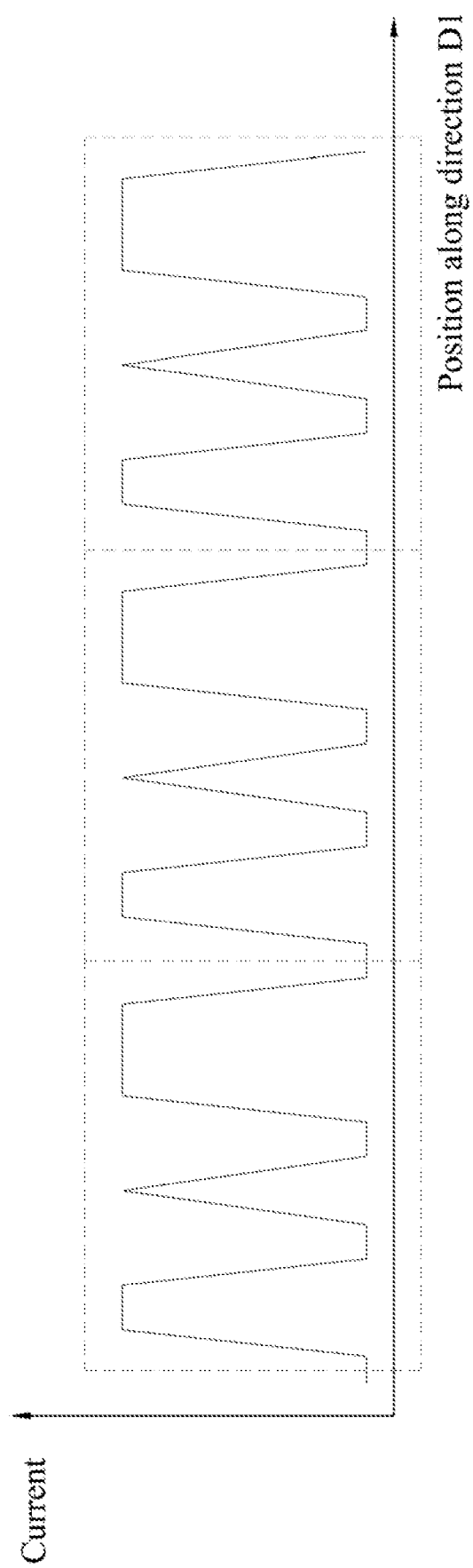
FIG. 5 is a schematic diagram illustrating a current distribution in accordance with some embodiments of the present disclosure.

In some embodiments, the current distribution may comprise waves having different shapes, but these waves can form wave packets having the same wave sequence. Please refer to FIG. 5. FIG. 5 is a current distribution in accordance with some embodiments of the present disclosure.

As shown in FIG. 5, the shapes of waves are not totally same, but these waves can form three wave packets having the same wave sequence. In some embodiments, the magnitude of the overlay shift can be calculated in step 170, based on the amount difference and the distribution (position) difference between the wave packets of the measurement result and the wave packets of the standard data.

It should be noted that the amounts, shapes and distributions (positions) of the waves of the current distribution in present disclosure are only examples, and are not intended to limit the present disclosure. The other amounts, shapes and distributions of the waves of the current distribution are within the scope of the present disclosure.

Figure 6:
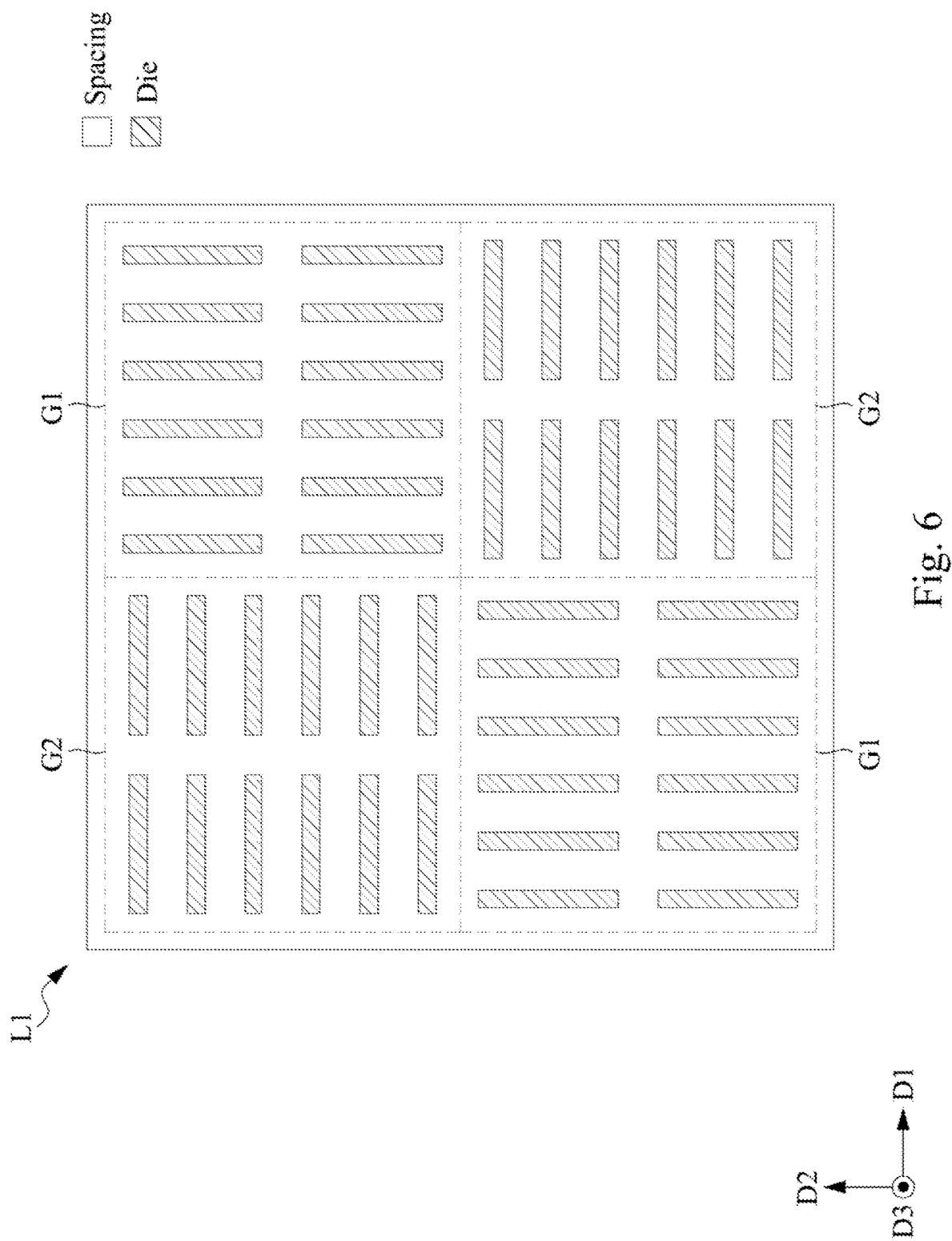
FIG. 6 is a top-view diagram of a to-be-measured wafer layer in accordance with some embodiments of the present disclosure.

In some embodiments, each of the to-be-measured wafer layer L1 and the previous wafer layer L2 may comprise a group G1 of dies and a group G2 of dies. Please refer to FIG. 6. FIG. 6 is a top-view diagram of the to-be-measured wafer layer L1 in accordance with some embodiments of the present disclosure.

In some embodiments, the groups G1 and G2 are arranged alternately in direction D1 and direction D2 on the to-be-measured wafer layer L1, therefore forming a checker disposition.

In some embodiments, the dies of group G1 are arranged in arrays having at least one column and at least one row, and extend in direction D2; the dies of group G2 are arranged in arrays having at least one column and at least one row, and extend in direction D1.

It should be noted that the amounts and distributions of the dies in groups G1 and G2 in present disclosure are only examples, and are not intended to limit the present disclosure. The other amounts and distributions of the dies in groups G1 and G2 are within the scope of the present disclosure. Since the arrangement of dies of the previous wafer layer L2 is similar to the to-be-measured wafer layer L1, similar descriptions are omitted.

Figure 7:
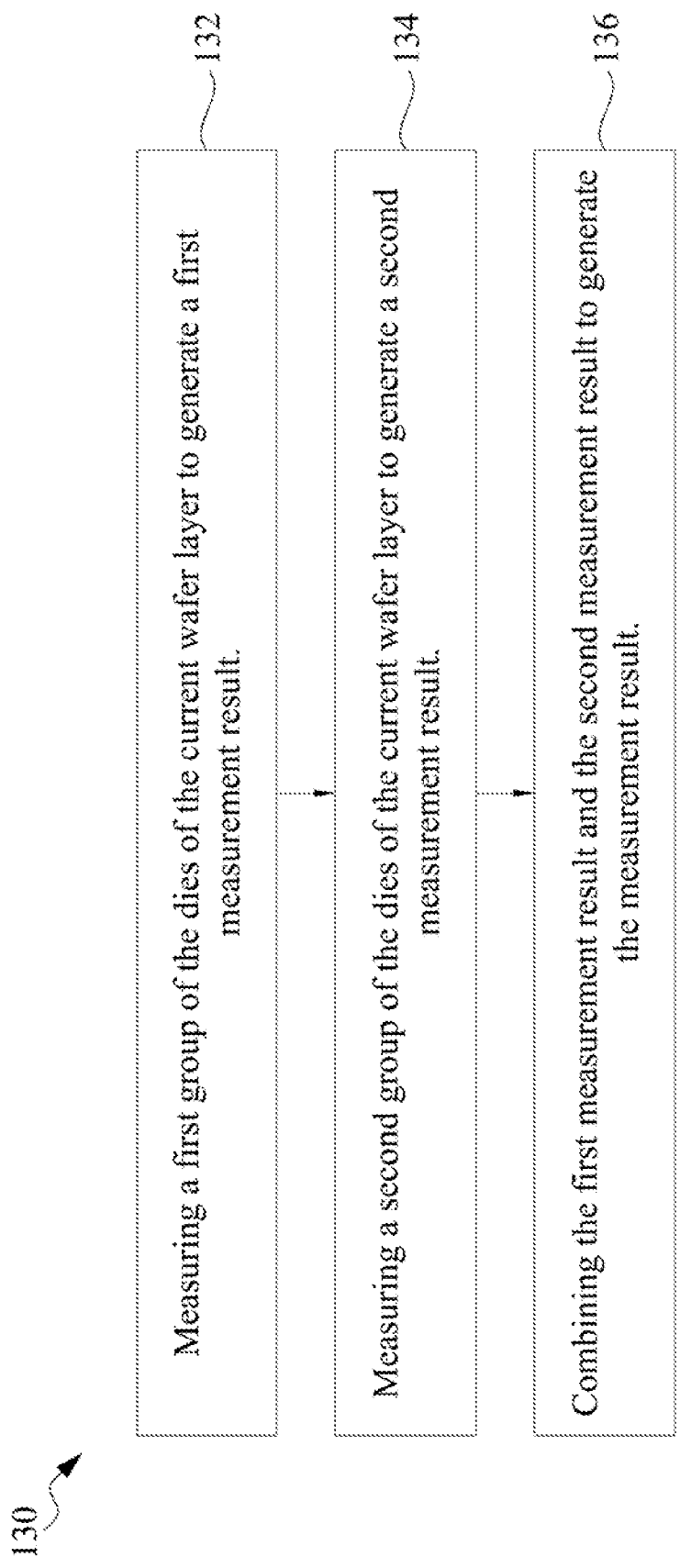
FIG. 7 is a detailed flowchart of step 130 in accordance with some embodiments of the present disclosure.

In the embodiments of FIG. 6, step 130 of the measuring method 100 further comprises steps 132-136. Please refer to FIG. 7. FIG. 7 is a detailed flowchart of step 130 in accordance with some embodiments of the present disclosure.

In step 132, the group G1 of the dies of the to-be-measured wafer layer L1 is measured, so as to generate a first measurement result. In step 134, the group G2 of the dies of the to-be-measured wafer layer L1 is measured, so as to generate a second measurement result. In step 136, the first measurement result and the second measurement result are combined to generate the aforementioned measurement result discussed with reference to FIG. 3.

It will be understood that the measuring method 100 discussed herein may comprise greater or fewer operations than illustrated in FIG. 1 and FIG. 7, and the steps 110-170 may be performed in any order, as appropriate. In some embodiments, step 132 may be performed after step 134. In some embodiments, steps 132 and 134 may be synchronously performed.

The present disclosure provides a non-transient computer readable storage medium storing a plurality of computer readable instructions, when the plurality of computer readable instructions are executed by one or a plurality of processors, the one or the plurality of processors is configured to perform the steps 110-170 of the measuring method 100 described above.

With the measuring method 100 and the non-transient computer readable storage medium of present disclosure, it is possible to measure the overlay shift between two adjacent wafer layers by directly measuring electrical properties of wafers, resulting in lower power consumption and more precise measurement results.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A measuring method for measuring an overlay shift between two wafers, comprising:
   providing a previous wafer layer, a to-be-measured wafer layer and a measuring circuit layer, wherein each of the previous wafer layer and the to-be-measured wafer layer comprises a first group of dies;
   measuring, by a plurality of probes of the measuring circuit layer, the first group of dies of the to-be-measured wafer layer;
   generating a measurement result according to at least the measuring to the first group of dies; and
   comparing the measurement result with a standard data to determine the overlay shift between the previous wafer layer and the to-be-measured wafer layer,
   wherein the to-be-measured wafer layer is between the previous wafer layer and the measuring circuit layer and is connected to the previous wafer layer and the measuring circuit layer,
   wherein at least a part of the first group of dies of the previous wafer layer is electrically connected to a part of the first group of dies of the to-be-measured wafer layer.

2. The measuring method of claim 1, wherein measuring, by the plurality of probes of the measuring circuit layer, the first group of dies of the to-be-measured wafer layer comprises:
   connecting the plurality of probes to the first group of dies of the to-be-measured wafer layer respectively; and
   measuring a conduction relationship between the first group of dies of the to-be-measured wafer layer,
   wherein generating the measurement result according to at least the measuring to the first group of dies comprises:
   using the conduction relationship between the first group of dies of the to-be-measured wafer layer as the measurement result.

3. The measuring method of claim 2, wherein the standard data represents a conduction relationship between a group of dies of a wafer layer having no overlay shift.

4. The measuring method of claim 3, wherein comparing the measurement result with the standard data to determine the overlay shift between the previous wafer layer and the to-be-measured wafer layer comprises:
   in response to that the measurement result is same as the standard data, determining that the overlay shift is equal to zero; and
   in response to that the measurement result is different from the standard data, determining that the overlay shift is greater than zero.

5. The measuring method of claim 1, wherein measuring, by the plurality of probes of the measuring circuit layer, the first group of dies of the to-be-measured wafer layer comprises:
   connecting the plurality of probes to the first group of dies of the to-be-measured wafer layer respectively; and
   measuring a current distribution of the first group of dies of the to-be-measured wafer layer,
   wherein generating the measurement result according to at least the measuring to the first group of dies comprises:
   using the current distribution of the first group of dies of the to-be-measured wafer layer as the measurement result.

6. The measuring method of claim 5, wherein the standard data represents the current distribution of a group of dies of a wafer layer having no overlay shift.

7. The measuring method of claim 6, wherein each of the measurement result and the standard data records an amount and a distribution of a plurality of wave packets, and the overlay shift is calculated according to an amount difference and a distribution difference between the plurality of wave packets of the measurement result and the plurality of wave packets of the standard data.

8. The measuring method of claim 7, wherein comparing the measurement result with the standard data to determine the overlay shift between the previous wafer layer and the to-be-measured wafer layer comprises:
   in response to that the amount difference and the distribution difference are zero, determining that the overlay shift is equal to zero; and
   in response to that at least one of the amount difference and the distribution difference is not zero, determining that the overlay shift is greater than zero.

9. The measuring method of claim 1, wherein the first group of dies extends in a first direction, wherein each of the previous wafer layer and the to-be-measured wafer layer further comprises a second group of dies extending in a second direction different from the first direction, and the measuring method further comprises:
   measuring, by the plurality of probes of the measuring circuit layer, the second group of dies of the to-be-measured wafer layer,
   wherein the measurement result is generated according to the measuring to the first group of dies and the measuring to the second group of dies.

10. The measuring method of claim 9, wherein the first group of dies of the to-be-measured wafer layer and the second group of dies of the to-be-measured wafer layer are arranged alternately in the first direction and the second direction; and
    the first group of dies of the previous wafer layer and the second group of dies of the previous wafer layer are arranged alternately in the first direction and the second direction.

11. A non-transient computer readable storage medium, storing a plurality of computer readable instructions, when the plurality of computer readable instructions are executed for measuring an overlay shift between two wafers, by one or a plurality of processors, the one or the plurality of processors is configured to perform the following operations:
    measuring, by a plurality of probes of a measuring circuit layer, a first group of dies of a to-be-measured wafer layer;
    generating a measurement result according to at least the measuring to the first group of dies; and
    comparing the measurement result with a standard data to determine the overlay shift between a previous wafer layer and the to-be-measured wafer layer,
    wherein the to-be-measured wafer layer is between the previous wafer layer and the measuring circuit layer and is connected to the previous wafer layer and the measuring circuit layer,
    wherein at least a part of the first group of dies of the previous wafer layer is electrically connected to a part of the first group of dies of the to-be-measured wafer layer.

12. The non-transient computer readable storage medium of claim 11, wherein measuring, by the plurality of probes of the measuring circuit layer, the first group of dies of the to-be-measured wafer layer comprises:
- connecting the plurality of probes to the first group of dies of the to-be-measured wafer layer respectively; and
- measuring a conduction relationship between the first group of dies of the to-be-measured wafer layer,
- wherein generating the measurement result according to at least the measuring to the first group of dies comprises:
- using the conduction relationship between the first group of dies of the to-be-measured wafer layer as the measurement result.

13. The non-transient computer readable storage medium of claim 12, wherein the standard data represents a conduction relationship between a group of dies of a wafer layer having no overlay shift.

14. The non-transient computer readable storage medium of claim 13, wherein comparing the measurement result with the standard data to determine the overlay shift between the previous wafer layer and the to-be-measured wafer layer comprises:
- in response to that the measurement result is same as the standard data, determining that the overlay shift is equal to zero; and
- in response to that the measurement result is different from the standard data, determining that the overlay shift is greater than zero.

15. The non-transient computer readable storage medium of claim 11, wherein measuring, by the plurality of probes of the measuring circuit layer, the first group of dies of the to-be-measured wafer layer comprises:
- connecting the plurality of probes to the first group of dies of the to-be-measured wafer layer respectively; and
- measuring a current distribution of the first group of dies of the to-be-measured wafer layer,
- wherein generating the measurement result according to at least the measuring to the first group of dies comprises:
- using the current distribution of the first group of dies of the to-be-measured wafer layer as the measurement result.

16. The non-transient computer readable storage medium of claim 15, wherein the standard data represents the current distribution of a group of dies of a wafer layer having no overlay shift.

17. The non-transient computer readable storage medium of claim 16, wherein each of the measurement result and the standard data records an amount and a distribution of a plurality of wave packets, and the overlay shift is calculated according to an amount difference and a distribution difference between the plurality of wave packets of the measurement result and the plurality of wave packets of the standard data.

18. The non-transient computer readable storage medium of claim 17, wherein comparing the measurement result with the standard data to determine the overlay shift between the previous wafer layer and the to-be-measured wafer layer comprises:
- in response to that the amount difference and the distribution difference are zero, determining that the overlay shift is equal to zero; and
- in response to that at least one of the amount difference and the distribution difference is not zero, determining that the overlay shift is greater than zero.

19. The non-transient computer readable storage medium of claim 11, wherein the first group of dies extends in a first direction, wherein each of the previous wafer layer and the to-be-measured wafer layer further comprises a second group of dies extending in a second direction different from the first direction, and the one or the plurality of processors is further configured to perform the following operation:
- measuring, by the plurality of probes of the measuring circuit layer, the second group of dies of the to-be-measured wafer layer,
- wherein the measurement result is generated according to the measuring to the first group of dies and the measuring to the second group of dies.

20. The non-transient computer readable storage medium of claim 19, wherein the first group of dies of the to-be-measured wafer layer and the second group of dies of the to-be-measured wafer layer are arranged alternately in the first direction and the second direction; and
- the first group of dies of the previous wafer layer and the second group of dies of the previous wafer layer are arranged alternately in the first direction and the second direction.

* * * * *